US006314036B1

(12) United States Patent
Cooper et al.

(10) Patent No.: US 6,314,036 B1
(45) Date of Patent: Nov. 6, 2001

(54) METHOD AND APPARATUS FOR EFFICIENTLY TESTING RAMBUS MEMORY DEVICES

(75) Inventors: Christopher B. Cooper, Boise, ID (US); Brian L. Brown, Allen; Thanh K. Mai, Plano, both of TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/708,692

(22) Filed: Nov. 7, 2000

Related U.S. Application Data

(63) Continuation of application No. 09/351,105, filed on Jul. 6, 1999, now Pat. No. 6,144,598.

(51) Int. Cl.$^7$ .................................................. Q11C 13/00
(52) U.S. Cl. .................... 365/201; 365/200; 365/189.02; 365/230.02
(58) Field of Search .................... 365/200, 201, 365/189.02, 230.02

(56) References Cited

U.S. PATENT DOCUMENTS 3,845,476 * 10/1974 Boehm ................................. 365/200
6,101,139    8/2000 Dean ..................................... 365/201
6,144,598 * 11/2000 Cooper et al. ........................ 365/201

* cited by examiner

Primary Examiner—Terrell W. Fears
(74) Attorney, Agent, or Firm—Dorsey & Whitney LLP

(57) ABSTRACT

A RAMBUS dynamic random access memory includes a test control circuit that selectively couples a row address latch to either a row sense control signal or a CMD control signal. In a normal operating mode, the test control circuit couples the row address latch to the row sense control signal so that the row sense control signal both latches a row address and senses a row of memory cells corresponding to the latched address. Prior to conducting a core noise test, the test control circuit couples the row address latch to the CMD control signal so that the row address is latched by the CMD control signal, and the row sense control signal only functions during the core noise test to sense a row corresponding to the latched row. The memory also includes a multiplexer that receives a time-multiplexed data/address bus and simultaneously couples a first part of the data/address bus to an internal data bus and a second part of the data/address bus to an internal address bus.

22 Claims, 5 Drawing Sheets

METHOD AND APPARATUS FOR EFFICIENTLY TESTING RAMBUS MEMORY DEVICES

CROSS-REFERENCE TO RELATED APPLICATION

This application is a continuation of pending U.S. patent application Ser. No. 09/351,105, filed Jul. 6, 1999 now U.S. Pat. No. 6,144,598.

TECHNICAL FIELD

The present invention relates to memory devices, and more particularly, to a method and apparatus for efficiently performing "core noise" tests on RAMBUS memory devices.

BACKGROUND OF THE INVENTION

Memory devices, such as dynamic random access memories ("DRAMs"), are in common use in computer systems and a wide variety of other electronic products. To insure reliability, DRAMs, are thoroughly tested at several phases of the manufacturing process. For example, DRAMs are tested in die form, i.e., when they are still part of a wafer, and they are tested again after they have been packaged. The large volume of DRAMs that must be tested in a production environment necessitate that testing be performed utilizing automatic test equipment. However, to minimize the cost of testing and to maximize testing throughput, it is important to test DRAMs as quickly as possible. In the past, the rate at which DRAMs can be tested has been increased by compressing the data written to and read from DRAMs. Using data compression, data applied to the DRAM is written to several memory cells, either simultaneously or sequentially in a single memory access cycle. Compressed data is then read from the DRAM by simultaneously coupling data bits from several memory cells to a logic circuit that provides an indication of whether the data read from the memory cells corresponds to the data written to the memory cells. Data compression can markedly reduce the time required to test a DRAM, with the reduction being roughly proportional to the degree of compression. Data compression techniques have been used with a variety of DRAMs, including asynchronous DRAMs and synchronous DRAMs.

Recently, a high-speed packetized memory device, known as a RAMBUS DRAM or "RDRAM", has been proposed for use in computer systems. The interface to an RDRAM 10 is shown in the block diagram of FIG. 1. The RDRAM 10 is coupled to first and second 9-bit time-multiplexed data/address buses 12, 14. Each of the buses 12, 14 can couple either an address to the RDRAM 10 or data to or from the RDRAM 10. Within the RDRAM 10, the data/address buses 12, 14 are coupled to a multiplexer 16 that is controlled by appropriate circuitry (not shown) to couple any of the buses 12, 14 to the either an internal address bus 18 or an internal data bus 20.

The RDRAM 10 is also coupled to an 8-bit command bus RQ<7:0> that receives command packets for controlling the operation of the RDRAM 10. One of these lines, RQ<0>, receives a TestBSENSE signal during a core noise test described below. This TestBSENSE signal is coupled through two inverters 22a,b to provide an internal BSENSE_in signal and a row address latch RADR_L signal. The RADR_L signal is applied to a Row Address Latch Circuit 26 that latches a row address applied to the RDRAM 10. The BSENSE_in signal is applied to a Row Sense Control Circuit 28 that senses a row of memory cells corresponding to the latched row address.

Finally, the RDRAM 10 is coupled to a plurality of control and status lines, including a command "CMD" line, a serial clock "SCK" line, and a pair of serial input/output "SIO<1:0>" lines. The SIO lines receive serial data on each transition of the serial clock SCK, such as such as control bits that are loaded into internal control registers, including a test option ("TO") register 24. The RDRAM 10 is, of course, also coupled to various power and ground lines, but these have been omitted for purposes of brevity.

It will be understood that the RDRAM 10 contains a large amount of circuitry in addition to the multiplexer 16 and the TO register 24. However, this other circuitry has been omitted in the interests of brevity and clarity since such circuitry is conventional in RDRAMs.

The RDRAM 10 illustrated in FIG. 1 includes internal circuitry specifically adapted to facilitate testing. One of these test modes, known as the "DA Mode", can be entered by setting a bit in a register either using the serial SIO port or issuing a command CMD through the command bus RQ<0:7>. Using these test modes, known data can be written to the RDRAM 10 and then read to verify the correct operation of the RDRAM 10 during production and thereafter. Another test, known as the core noise test, tests the RDRAM 10 under what may be considered "worst-case" conditions. In the core noise test, three events occur simultaneously, namely one of the memory banks (not shown) of the RDRAM 10 is precharged, data are written to or read from a memory location in the RDRAM 10, and a row of memory cells in a memory bank is "sensed," i.e., the memory cells are coupled to respective digit lines and their respective sense amplifiers respond thereto. Under these circumstances, it is possible for signals on various lines in the RDRAM 10 to be coupled to each other. The core noise test is selected by setting a core noise bit in the TO register 24 (FIG. 1) when it is programmed as described above. Once the TO register 24 has been programmed to perform a core noise test, the core noise option is alternately enabled and disabled by toggling the CMD signal line, which is coupled to the TO register 24.

In the DA test mode, the signals coupled to the lines and buses connected to the RDRAM 10 are given by the following table:

TABLE 1

| | |
|---|---|
| DQA<0> | DQ/Address |
| DQA<1> | DQ/Address |
| DQA<2> | DQ/Address |
| DQA<3> | DQ/Address |
| DQA<4> | DQ/Address |
| DQA<5> | DQ/Address |
| DQA<6> | DQ/Address |
| DQA<7> | DQ/Address |
| DQA<8> | DQ/Address |
| DQB<0> | DQ/Address |
| DQB<1> | DQ/Address |
| DQB<2> | DQ/Address |
| DQB<3> | DQ/Address |
| DQB<4> | DQ/Address |
| DQB<5> | DQ/Address |
| DQB<6> | DQ/Address |
| DQB<7> | DQ/Address |
| DQB<8> | DQ/Address |
| RQ<0> | TestBSENSE |
| RQ<1> | TestPRECH |
| RQ<2> | TestWRITE |
| RQ<3> | TestCOLLAT |
| RQ<4> | TestCOLCYC |

TABLE 1-continued

| RQ<5> | TestDSTB |
|---|---|
| RQ<6> | TestBLOCKD |
| RQ<7> | TestBLKSEL |
| CFM | TestCLKW |
| CFMN | VCC/2 |
| CTM | TestCLKR |
| CTMN | VCC/2 |
| SCK | SCK |
| CMD | CMD |
| SIO<0> | SIO<0> |
| SIO<1> | SIO<1> |

The signal interface to the RDRAM 10 for the core noise test will now be explained with reference to the timing diagram of FIG. 2. Although many of the signals indicated above are used in various DA Mode tests, only the signals used in the DA Mode core noise test are illustrated in FIG. 2. Prior to time $t_1$, a five-bit bank address PBSEL<4:0> is placed on one of the DQ/Address bus lines 11–16. At time $t_1$, the precharge signal TestPRECH applied to the RQ<1> line transitions high. The TestPRECH signal is a control signal that causes the RDRAM 10 to latch an address present on the DQ/Address bus lines 11–16 and precharge a bank of memory cells designated by the latched address. Thus, at time $t_1$, the bank designated by the PBSEL<4:0> bank address is precharged.

Prior to time $t_2$, a 5-bit bank address SBSEL<4:0> is again placed on lines 11–16 of the DQ/Address bus, and an 11-bit row address RADR<10:0> is again placed on lines 0–10 of the DQ/Address bus. The bank address SBSEL<4:0> and the row address RADR<10:0> correspond to a bank and row, respectively, of memory cells that are to be sensed. When the row of memory cells is sensed, each memory cell in the row is coupled to a respective digit line, a complementary pair of which is provided for each column, and a sense amplifier coupled to each complementary pair of digit lines responds thereto. Sensing a row is, of course, a precursor to reading data from selective columns of memory cells in that row At time $t_2$, a TestBSENSE signal applied to the RQ<0> line transitions low. The TestBSENSE signal is a control signal that causes the RDRAM 10 to latch a row and bank address present on lines 0–10 and 11–16, respectively, of the DQ/Address bus and sense a row of memory cells in the bank corresponding to the latched row and bank address. Thus, at time $t_2$, the row designated by RADR<10:0> in the bank designated by SBSEL<4:0> is sensed.

At time $t_3$, a TestBLKSEL signal applied to the RQ<7> line transitions high. As explained further below, when the TestBLKSEL signal is high, the function of the TestPRECH signal is altered.

At time $t_4$, the core noise test is conducted. Prior to time $t_4$, another bank address, CBSEL<4:0>, is placed on lines 11–16 of the DQ/address bus, and a column address CADR<10:0> is placed on lines 0–10 of the DQ/address bus. At time $t_4$, a test column latch TestCOLLAT signal applied to the RQ<3> line transitions high. The TestCOLLAT signal causes the column address CADR<10:0> to be latched, and data signals to be coupled from or to the column designated by the latched column address. The data signals coupled from or to the column designated by the latched column address are in the row and bank that was previously sensed at time $t_2$, as explained above. The RDRAM 10 thus reads data from or writes data to the column corresponding to the column address CADR<10:0> present at time $t_4$ in the row and bank corresponding to the row address RADR<10:0> and bank address SBSEL<4:0> present at time $t_2$.

At time $t_4$, the TestBSENSE signal again transitions low. As explained above, when the TestBSENSE signal transitions low, a row designated by an address on lines 0–10 of the DQ/address bus in the bank designated by an address on lines 11–16 of the DQ/address bus is sensed. However, since it is necessary for the column address CADR<10:0> to be present on lines 0–10 of the DQ/address bus at time $t_4$ to designate the column that is to be accessed in a read or a write, the column address CADR<10:0> is also used as the row address for sensing a row responsive to the transition of the TestBSENSE signal. Thus, at time $t_4$, a row designated by the column address CADR<10:0> in the bank designated by the bank address CBSEL<4:0> present on lines 11–16 of the DQ/address bus at $t_4$ is sensed. It is thus apparent that the row that is sensed during the core noise test must have the same address as the column that is accessed during the core noise test. This row/column dependency limits the flexibility in which the core noise test can be performed since it is not possible to independently select a row to be sensed when selecting a column to be accessed. Although this dependency is undesirable, there does not seem to be any solution because there are insufficient address lines to provide separate bank, row, and column addresses to the RDRAM 10 at the same time during the core noise test.

As mentioned above, the core noise test requires three events to occur at the same time. Sensing of a row and accessing a column of memory has been explained above. In addition, a bank of memory must also be precharged at us the same time. As explained above, banks of memory cells are precharged by the TestPRECH signal transitioning high, which then latches a bank address present on lines 11–16 of the DQ/address bus and precharges a bank corresponding to the latched address. However, as explained above, the address present on lines 11–16 of the DQ/address bus at time $t_4$ corresponds to the bank to be sensed responsive to the TestBSENSE signal transitioning low. While this address could also theoretically be used to designate the bank to be precharged (in much the same manner that the column address at time $t_4$ designates the row address), in practice it is not possible to both precharge and sense a bank. For this reason, the function of the TestPRECH signal is altered responsive to the TestBLKSEL signal on the RQ<7> control line transitioning high at time $t_3$, as alluded to above. Thereafter, the TestPRECH signal is still used to precharge a bank, but it does not precharge the bank designated by an address present on lines 11–16 of the DQ/address bus. Instead, the transition of the TestPRECH signal precharges a bank corresponding to 1 bank higher then the bank most recently precharged. Thus, the bank that is precharged at time $t_4$ responsive to the TestPRECH signal is one bank higher than the bank precharged at time $t_1$. For example, if bank 14 was precharged at time $t_1$, then bank 15 will be precharged at time $t_4$ during the core noise test.

It will be noted that 17 of the 18 lines of the DQ/address buses 12, 14 are used to provide addresses during the core noise test. For this reason, data coupled to or from the RDRAM 10 must be time-multiplexed with the addresses present on the DQ/address lines. The inability to couple data to or from the RDRAM 10 at the same time that addresses are coupled to the RDRAM 10 increases the time needed to test RDRAMs 10. While it would be desirable to couple data to or from RDRAMs 10 at the same time that they are addressed, this does not seem to be possible since there are not even enough DQ/address lines to eliminate the row/column dependency described above.

The inability to either solve the row/column dependency problem or allow coupling of data to or from RDRAMs at the same time that they are addressed would be exacerbated by any attempt to reduce the number of lines that are used to couple signals to or from RDRAMs 10 during the core noise test. However, it is desirable to minimize the number of signal lines that must be used during testing for several reasons. For example, automatic test equipment used to test DRAMs having fewer number of signal lines than RDRAMs might be incapable of testing RDRAMs. Such automatic test equipment, which is very expensive, would then be obsolete. It would be desirable to be able to use older automatic test equipment to test RDRAMs. However, doing so, even if it were possible, would appear to only exacerbate the row/column dependency problem and the need to multiplex data and address signals.

There is therefore a need to be able to more efficiently test RDRAMs by reducing the number of connections that must be made to RDRAMs during core noise testing without requiring the multiplexing of data and address signals and without making the row to which a read or write accesses occurs being dependent on the column that is accessed.

SUMMARY OF THE INVENTION

A RAMBUS dynamic random access memory ("RDRAM") having a time-multiplexed data/address bus is tested according to one aspect of the invention by dedicating a first part of the data/address bus to addresses and dedicating a second part of the data/address bus to data. During testing, addresses are applied to the RDRAM simultaneously with the coupling of data to or from the RDRAM.

The RDRAM includes a row address latch circuit that is coupled to receive a row sense control signal during normal operation of the RDRAM. The row sense control signal causes a row address to be latched, and the row sense control signal also causes a row corresponding to the latched row address to be sensed. In another aspect of the invention, the row address latch circuit is decoupled from the row sense control signal prior to conducting a core noise test of the RDRAM. The row address latch circuit is instead coupled to another control input of the RDRAM. As a result, a row address corresponding to the row to be sensed during the core noise test can be latched in the RDRAM prior to the core noise test, and the row sense control signal can be applied during the core noise test to sense a row corresponding to the latched address. Since the row address latch is decoupled from the row sense control signal at that time, an address different from the address of the sensed row can be applied to the RDRAM during the core noise test.

In another aspect of the invention, the RDRAM receives bank addresses that designate a plurality of banks that are active during a core noise test. As a result, data are simultaneously coupled to or from a plurality of banks during the core noise test. In the event of a read memory access during the core noise test, read data from a plurality of banks are coupled to a data compression circuit. The compression circuit then outputs data indicative of the data read from all of the banks.

DETAILED DESCRIPTION OF THE INVENTION

Figure 1:
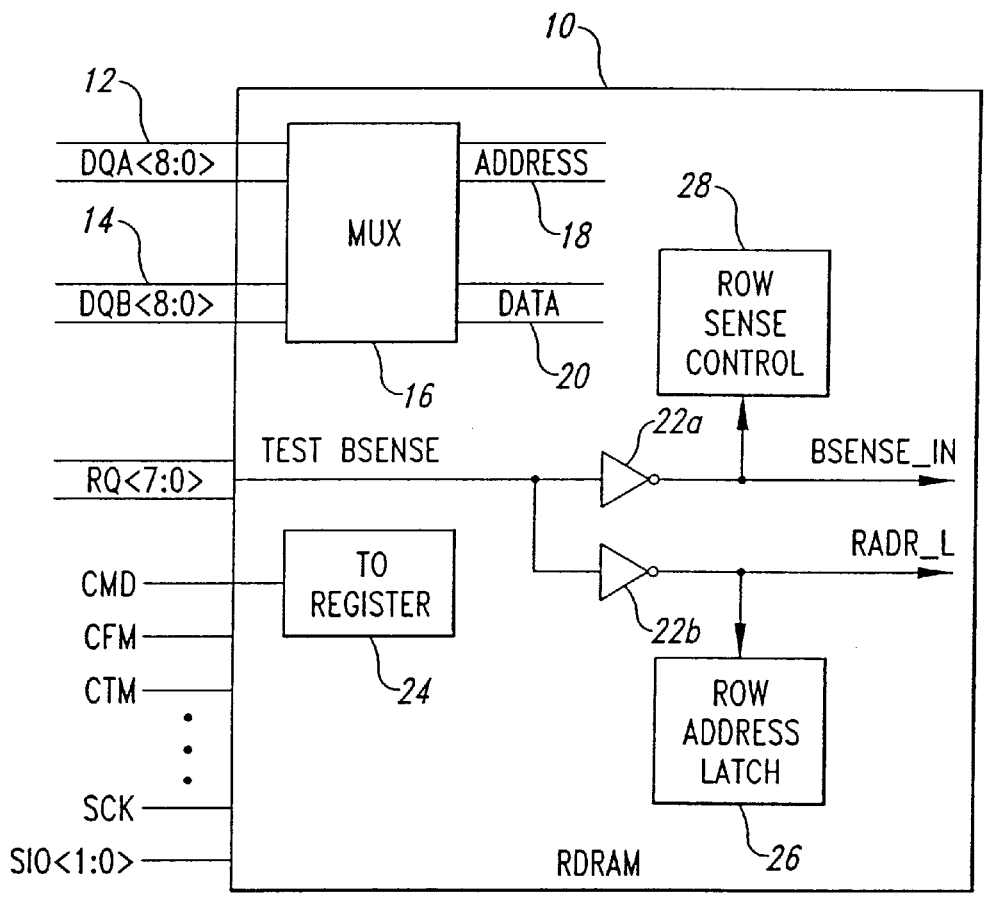
FIG. 1 is a block diagram of a conventional RDRAM showing selected internal components and the signal interfaces to the RDRAM.
Figure 3:
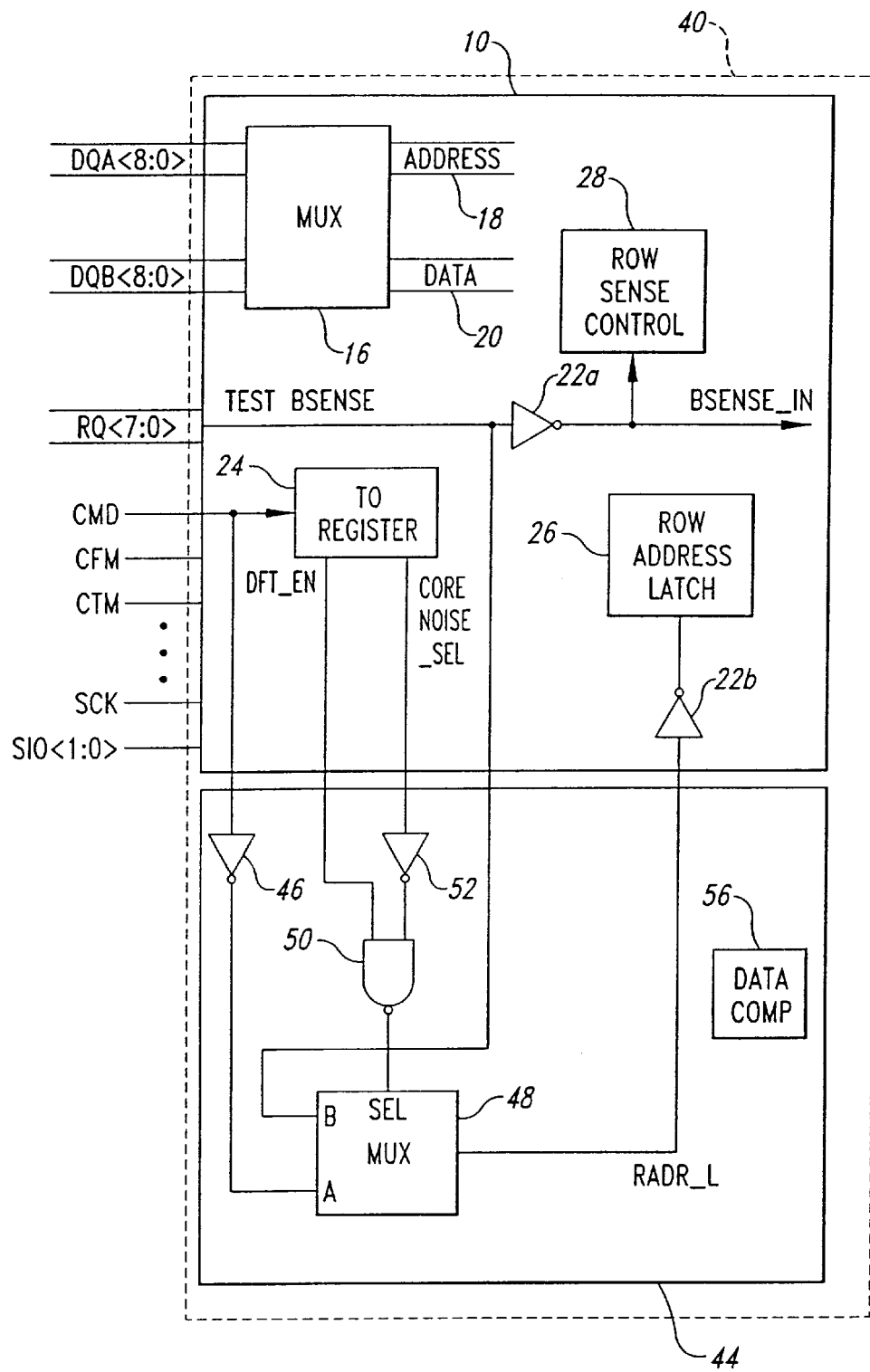
FIG. 3 is a block diagram of an embodiment of an RDRAM in accordance with the invention showing a core noise test control circuit coupled to the RDRAM of FIG. 1.

One embodiment of an RDRAM 40 in accordance with the invention is illustrated in FIG. 3. The RDRAM 40 includes the conventional RDRAM 10 of FIG. 1 coupled to a core noise test control circuit 44. In practice, the conventional RDRAM 10 and the core noise test control circuit 44 are preferably fabricated as a single integrated circuit. However, the core noise test control circuit 44 can alternatively be fabricated as a separate integrated or non-integrated circuit coupled to the conventional RDRAM 10.

As explained in greater detail below, the basic function of the core noise test control circuit 44 is to selectively decouple the row address latch circuit 26 from the TestBSENSE signal so that the TestBSENSE signal can cause a row to be sensed corresponding to a row address that has been latched at an earlier time. As a result, the row address corresponding to the row to be sensed during the core noise test can be latched prior to the core noise test. Then, the TestBSENSE signal applied during the core noise test causes sensing of the row corresponding to the latched row address. Since the address of the sensed row need not be applied at this time, address lines are available during the core noise test to apply to the RDRAM 40 a column address for the memory read or write access and a bank address corresponding to the bank in which the row to be sensed is located. In contrast, in the conventional RDRAM 10, the TestBSENSE signal causes a row address to be latched and also causes the row corresponding to the latched row address to be sensed. As a result, the address lines must be used during the core noise test to apply the address of the sensed row to the RDRAM 10.

The core noise test control circuit 44 receives the command CMD signal applied to the RDRAM 10 and couples it through an inverter 46 to one input of a multiplexer 48. The other input of the multiplexer 48 receives the TestBSENSE signal. As mentioned above, an internal BSENSE_in signal applied to the row sense control circuit 28 is derived from the TestBSENSE signal that is applied through the RQ<0> control line.

The multiplexer 48 is controlled by the output of a NAND gate 50 that receives a DFT_en signal from the test option register 24 and a Core Noise_sel signal from the test option register 24 through an inverter 52. As explained above, the test option register 24 is programmed through either the serial I/O port SIO<1:0> in synchronism with the serial clock SCK signal or through a command applied through the command bus RQ<7:0>. The test option register 24 is programmed to make the Dft_en signal active high during any of the DFT test modes, which correspond to the DA test modes in the conventional RDRAM 10. After a core noise bit has been set in the test option register 24, the Core Noise_sel signal is toggled by the CMD signal, which is coupled to the TO register 24. As explained below, the CMD signal toggles the Core Noise_sel active low during the core noise test, which is one of the DFT test modes.

During the core noise test, the active high Dft_en signal and the active low Core Noise_sel signal cause the NAND gate 50 to output a low that causes the multiplexer 48 to couple its output to the "A" the input. The row address latch RADR__L signal then corresponds to the command CMD signal applied to the RDRAM 40. As a result, the command CMD signal can transition high prior to the core noise test thereby generating a row address latch RADR__L signal to cause the row address latch circuit 26 to latch a row address applied to the RDRAM 40. Then, during the core noise test, the TestBSENSE signal can transition to low to sense a row corresponding to the latched row address. Significantly, the TestBSENSE signal applied during the core noise test does not generate a row address latch RADL__L signal so that other addresses can be latched by other signals during the core noise test, as explained above.

In operating modes other than the core noise test, the output of the NAND gate 50 is high, thereby causing the multiplexer 48 to couple its output to the "B" input of the multiplexer 48. As a result, the internal BSENSE__in signal is coupled to the input of the inverter 22b so that the row address latch RADR__L signal is generated by the TestBSENSE signal in the same manner as in the conventional RDRAM 10 of FIG. 1.

The core noise control circuit 44 also includes a conventional data compression circuit 56 that compresses data coupled to or from the RDRAM 40 as understood by one skilled in the art.

During the core noise test, the signals coupled to the lines and buses connected to the RDRAM 40 are given by the following table:

TABLE 2

| DQA<0> | Address |
| DQA<1> | Address |
| DQA<2> | Address |
| DQA<3> | Address |
| DQA<4> | DQ<0> |
| DQA<5> | DQ<2> |
| DQA<6> | Not Used |
| DQA<7> | Not Used |
| DQA<8> | Not Used |
| DQB<0> | Address |
| DQB<1> | Address |
| DQB<2> | Address |
| DQB<3> | Address |
| DQB<4> | DQ<1> |
| DQB<5> | DQ<3> |
| DQB<6> | Address |
| DQB<7> | Not Used |
| DQB<8> | Not Used |
| RQ<0> | TestBSENSE |
| RQ<1> | TestPRECH |
| RQ<2> | TestWRITE |
| RQ<3> | TestCOLLAT |
| RQ<4> | Not Used |
| RQ<5> | Not Used |
| RQ<6> | Not Used |
| RQ<7> | Not Used |
| CFM | TestCLK__R/W |
| CFMN | VCC/2 |
| CTM | TestCLK__R/W |
| CTMN | VCC/2 |
| SCK | SCK |
| CMD | CMD |
| SIO<0> | SIO<0> |
| SIO<1> | Not Used |

The operation of the RDRAM 40 during a core noise test will now be explained with reference to the timing diagram of FIG. 4. Prior to time to, a bank address PBSE <3,2,0> is applied to address lines 6–8, corresponding to lines 3,2, and 0 of the DQ/address bus. It will be recalled that there are 32 banks in the RDRAM 10, so that 5 address bits are required to individually select a bank. However, by selecting banks using only 3 bits, multiple banks are selected at the same time to provide bank compression, as explained in greater detail below. Since the address bits 4 and 1 are not used, the banks are selected in respective groups specified in Table 3, below:

TABLE 3

| Address 000 | Banks 0, 2, 16, 18 |
| Address 001 | Banks 1, 3, 17, 19 |
| Address 010 | Banks 4, 6, 20, 22 |
| Address 011 | Banks 5, 7, 21, 23 |
| Address 100 | Banks 8, 10, 24, 26 |
| Address 101 | Banks 9, 11, 25, 27 |
| Address 110 | Banks 12, 14, 28, 30 |
| Address 111 | Banks 13, 15, 29, 31 |

By using 3 three address bits to select banks, two significant advantages are achieved. First, the number of address lines that must be used to select banks is reduced, thereby reducing the number of address lines that are required to conduct a core noise test. Reducing the number of address lines may also allow older automatic test equipment to be used to test RDRAMs 40. Second, by using only 3 address bits to simultaneously select multiple banks, data is inherently written to or read from multiple banks at the same time. As a result, the number of data bits coupled to or from the RDRAM 40 is reduced since the data bits from each bank can be combined in conventional compression circuitry. The reduced number of data bits also frees up additional lines for addresses (since the DQ/address lines are time-multiplexed) and may allow older automatic test equipment to be used to test the RDRAM 40.

Figure 4:
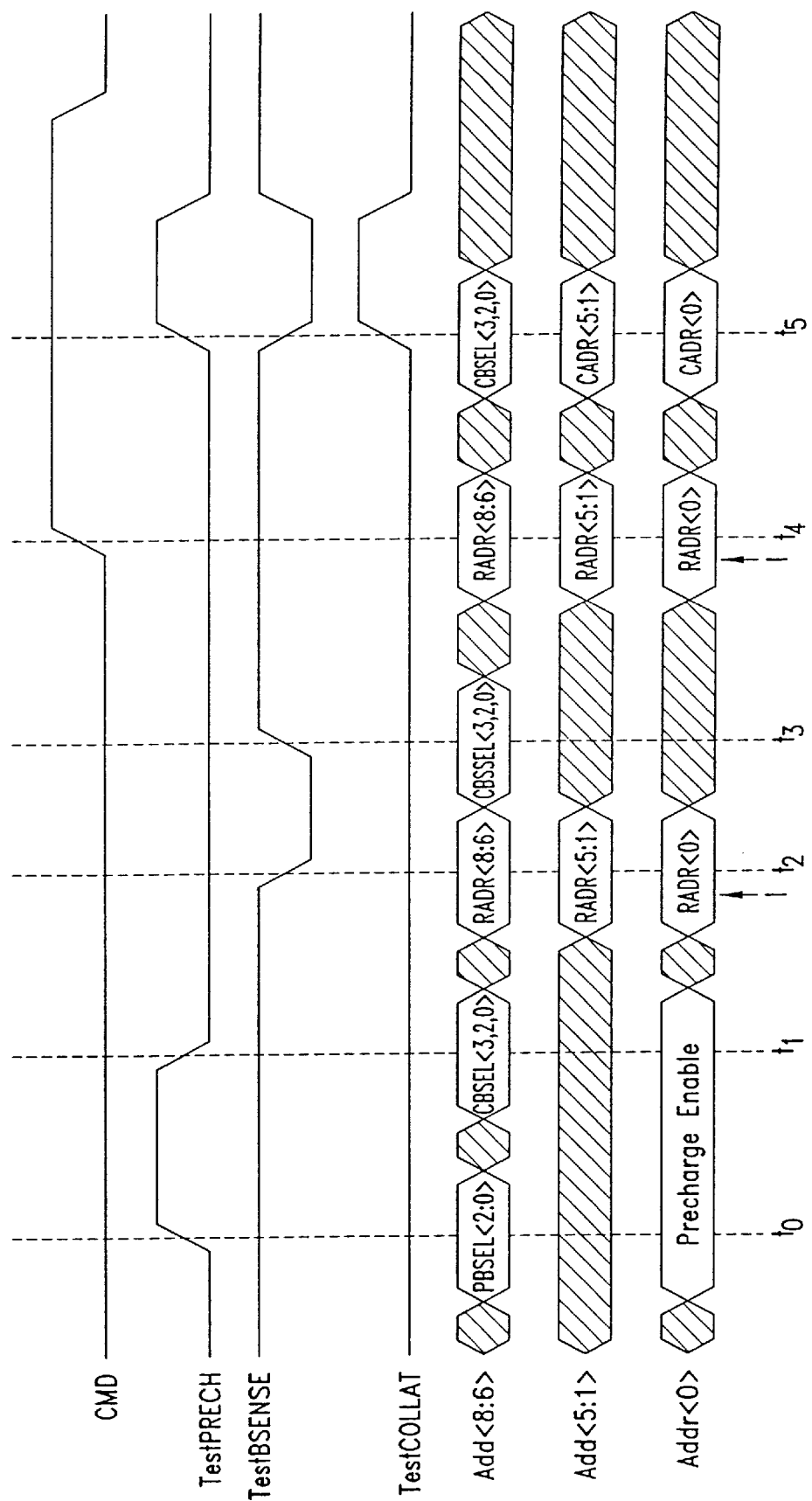
FIG. 4 is a timing diagram showing one embodiment of a core noise test of the RDRAM of FIG. 3 in accordance with one embodiment of the invention.

With further reference to FIG. 4, the bank address PBSEL<3,2,0> applied to address lines 6–8 is used to designate 4 banks that will be precharged responsive to the TestPRECH signal transitioning high at time $t_0$. As explained below, this bank address also designates the banks that will be precharged during the core noise test since the subsequently precharged banks have a bank address that is 1 higher than the bank address present at time $t_0$.

Prior to time $t_1$, a second bank address CBSEL<3,2,0> is applied to address lines 6–8. This bank address designates the bank that is to be sensed during the core noise test, as explained further below. The bank address CBSEL<3,2,0> is latched into the RDRAM 40 responsive to the TestPRECH signal transitioning low at time $t_1$.

Prior to time $t_2$, a 9-bit row address RADR<8:0> is applied to all 9 address lines in 3 separate groups, namely RADR<0> on address line 0, RADR<5:1> on address lines 1–5, and RADR<8:6> on address lines 6–8. Although a core noise bit in the T0 register 24 (FIG. 3) has been set, the Core Noise__sel signal remains inactive high until the CMD signal subsequently transitions to toggle the register 24, as explained above. The multiplexer 48 (FIG. 3) therefore continues to couple the row address latch circuit 26 to the TestBSENSE signal. Thus, the TestBSENSE signal latches the addresses on all of the address lines at time $t_2$.

The transition of the TestBSENSE signal also causes a row corresponding to the latched row address to be sensed that time $t_2$. As mentioned above, sensing a row is a precursor to reading data bits for columns in that row. Sensing of a row at time $t_2$ allows data bits to be read from a column in that row during the subsequent core noise test.

Prior to time $t_3$, another bank address CBSEL<3,2,0> is applied to address lines 6–8, and it is latched responsive to the TestBSENSE signal transitioning high at time $t_3$. This bank address designates the banks from which data will subsequently be read from or written to during the core noise test. Thus, at time $t_3$, the addresses of the row and bank that will be accessed during the core noise test have been latched.

The command CMD signal transitions high at time $t_4$, thereby toggling the T0 register 24 (FIG. 3) to drive the Core Noise_sel signal active low, as mentioned above. The multiplexer 48 (FIG. 3) then decouples the row address latch circuit 26 from the TestBSENSE signal so that subsequent transitions of the TestBSENSE signal do not latch a row address. Prior to time $t_4$, a 9-bit row address RADR<8:0> is applied to all 9 address lines in 3 separate groups, namely RADR<0> on address line 0, RADR<5:1> on address lines 1–5, and RADR<8:6> on address lines 6–8. The command CMD signal transitioning high at time $t_4$ latches the addresses on all of these lines. As explained below, a row corresponding to the row address latched at $t_4$ is sensed during the core noise test.

The core noise test occurs at time $t_5$. At that time, the TestPRECH signal transitions high to precharge four banks of the RDRAM 40. As mentioned above, the banks that are precharged are the banks that have bank addresses numbered one higher than the bank addresses of the banks previously precharged at time $t_0$. Thus, it is not necessary to use any DQ/address lines 12, 14 to apply an address to the RDRAM 40 for the purpose of designating the banks to be precharged during the core noise test.

Figure 2:
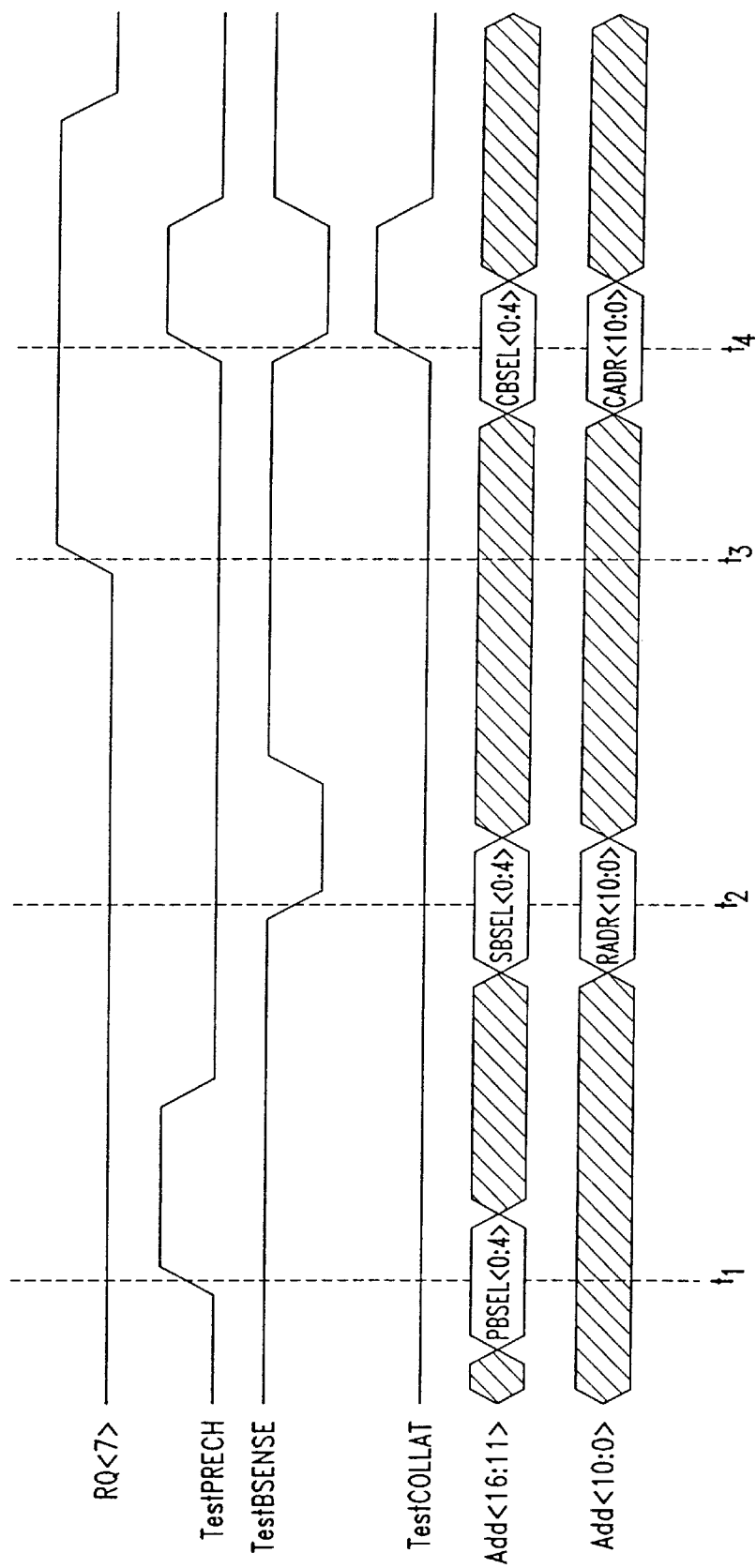
FIG. 2 is a timing diagram showing a conventional core noise test of the RDRAM of FIG. 1.

It will be recalled that the row address designating the row that will be accessed during the core noise test was latched at time $t_2$, and the bank address designating the banks containing the rows to be accessed was latched at time $t_3$. Prior to time $t_5$, a 6-bit column address CADR<5:0> is applied in two groups to address line 0 and address lines 1–5. This column address is used to access a column in each row of the four banks designated at times $t_2$ and $t_3$, respectively. It is important to note that the column address CADR<5:0> is independent, and thus can be different from, the row address latched at time $t_2$. Thus, unlike the conventional RDRAM 10 of FIG. 1, and as explained with reference to FIG. 2, there is no row/column dependency in performing a read or write memory access during the core noise test.

The final event that occurs during the core noise test is sensing rows in 4 banks. It will be recalled that the row address designating the row to be sensed was latched at time $t_4$. Prior to time $t_5$, a compressed bank address CBSEL<3, 2,0> is applied to address lines 6–8. The TestBSENSE signal transitioning causes the sensing of a row corresponding to the row address latched at $t_4$ in each of four banks corresponding to the compressed bank address present at $t_5$. Note, however, that unlike the conventional RDRAM 10, the TestBSENSE signal does not cause an address present on the DQ/address lines to be latched since the multiplexer 48 (FIG. 3) has decoupled the row address latch circuit 26 from the TestBSENSE signal. Thus, no DQ/address lines are needed to apply a row address corresponding to the row to be sensed during the core noise test. As a result, it is possible to conduct a core noise test on the RDRAM 40 using relatively few signal lines, thereby potentially allowing older automatic test equipment to be used.

It should also be noted that the core noise test is performed without multiplexing addresses and data on the DQ/address lines 12, 14. As a result, testing can proceed at a significantly faster pace compared to the testing of conventional RDRAMs 10. Furthermore, multiplexing address and data is avoided without requiring that a large number of signal lines be used to interface to the RDRAM 40. This reduction of interface lines is facilitated because of the address and data compression that occurs in the RDRAM 40.

Figure 5:
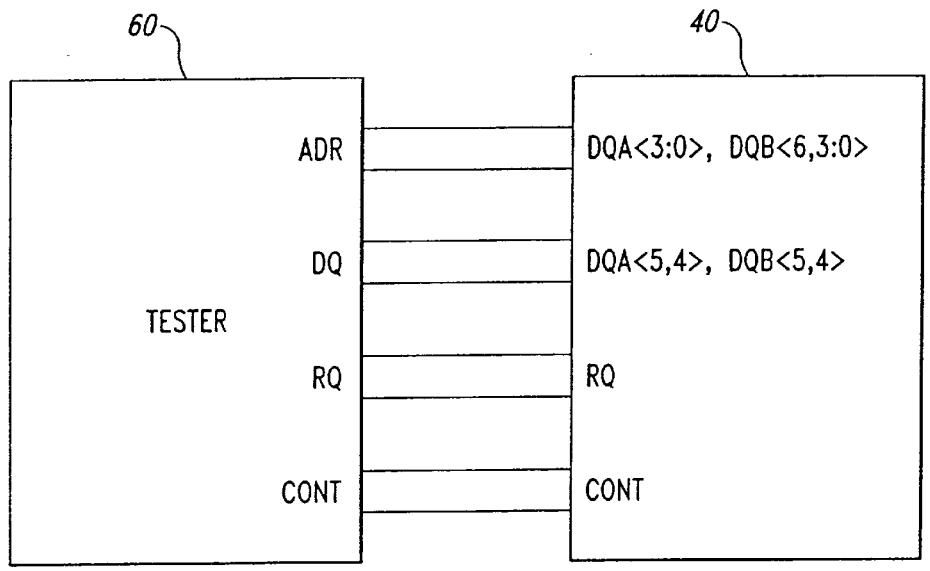
FIG. 5 is a block diagram showing the RDRAM of FIG. 3 being tested with conventional automatic test equipment.

FIG. 5 is a block diagram illustrating the testing of the RDRAM 40 of FIG. 3. The RDRAM 40 is coupled to an automatic tester 60 of conventional design. The tester 60 includes a 9-bit address bus ADR coupled to the DQA<3:0> and DQB<6,3:0> lines of the RDRAM 40, a 4-bit data bus DQ coupled to the DQA<5:4> and DQB<5:4> lines of the RDRAM 40, and 8-bit RQ bus coupled to the RQ lines of the RDRAM 40, and a control bus coupled to the control lines of the RDRAM 40. The tester 60 applies appropriate signals to the RDRAM 40, such as the type illustrated in FIG. 4, and receives data from the RDRAM 40. The tester 60 then compares the data received from the RDRAM 40 to determine if the data are invalid, which is indicative of a defective RDRAM 40.

Figure 6:
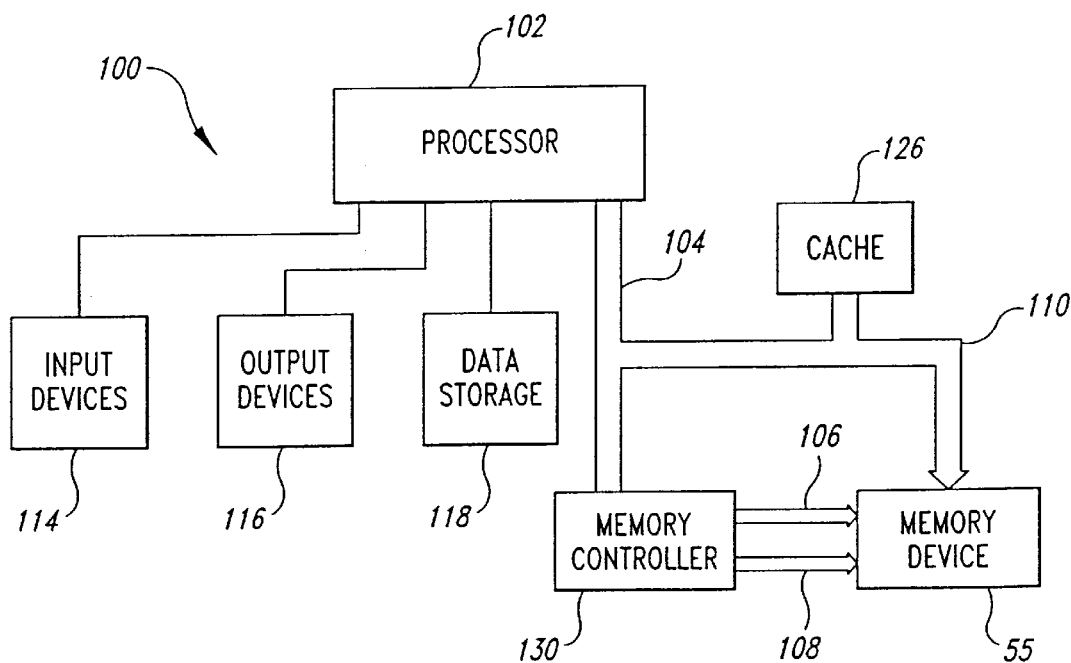
FIG. 6 is a block diagram of a computer system containing the RDRAM of FIG. 3.

FIG. 6 is a block diagram illustrating a computer system containing the RDRAM 40. The computer system 100 includes a processor 102 for performing various computing functions, such as executing specific software to perform specific calculations or tasks. The processor 102 includes a processor bus 104 that normally includes an address bus 106, a control bus 108, and a data bus 110. In addition, the computer system 100 includes one or more input devices 114, such as a keyboard or a mouse, coupled to the processor 102 to allow an operator to interface with the computer system 100. Typically, the computer system 100 also includes one or more output devices 116 coupled to the processor 102, such output devices typically being a printer or a video terminal. One or more data storage devices 118 are also typically coupled to the processor 102 to store data or retrieve data from external storage media (not shown). Examples of typical storage devices 118 include hard and floppy disks, tape cassettes, and compact disk read-only memories (CD-ROMs). The processor 102 is also typically coupled to cache memory 126, which is usually static random access memory ("SRAM") and to the RDRAM 40 through a memory controller 130. The memory controller 130 normally includes the DQ/Address and RQ buses 106 and signal lines 108 that are adapted to be coupled to the RDRAM 40.

It will be understood that even though various embodiments and advantages of the present invention have been set forth in the foregoing description, the above disclosure is illustrative only, and changes may be made in detail, and yet remain within the broad principles of the invention. For example, many of the components described above may be implemented using a variety of circuits, and also, details such as the number of banks of the RDRAM 40 that are accessed at the same time, may be altered as desired. Therefore, the present invention is to be limited only by the appended claims.

What is claimed is:

1. A method of conducting a test of a RAMBUS dynamic random access memory ("RDRAM") having a multiplexed data/address bus, comprising:

applying an address to the RDRAM corresponding to a first portion of the RDRAM via a first part of the data/address bus; and simultaneously with the applying an address to the RDRAM, coupling data to or from a second portion of the RDRAM via a second part of the data/address bus, the second portion of the RDRAM being at least partially different from the first portion.

2. The method of claim 1 wherein applying an address to the RDRAM comprises applying a first bank address and a first row address to at least part of the data/address bus of the RDRAM.

3. The method of claim 2 wherein applying a first bank address and a first row address comprises applying the first row address to the data/address bus prior to the test and applying the first bank address to the data/address bus during the test.

4. The method of claim 1, further comprising applying a second bank address, a second row address and a column address to at least part of the data/address bus of the RDRAM.

5. The method of claim 4 wherein applying a second bank address, a second row address and a column address comprises applying the second row and the second bank address to the data/address bus prior to the test and applying the column address to the data/address bus during the test.

6. The method of claim 4 wherein applying a second bank address, a second row address and a column address comprises applying a column address to the data/address bus of the RDRAM that is different from the second row address applied to the data/address bus of the RDRAM.

7. A method of conducting a test of a RAMBUS dynamic random access memory ("RDRAM") having a multiplexed data/address bus, comprising:
    latching a row address of said memory using a signal; and
    amplifying a value stored at said row address using said signal, wherein said latching and said amplifying occur at discrete times.

8. The method of claim 7 wherein amplifying a value stored at said row address using said signal comprises selectively decoupling a row address latch circuit from the signal so that the signal can cause a different row to be sensed.

9. The method of claim 8 wherein the different row to be sensed comprises a row address that has been previously latched.

10. The method of claim 7 wherein latching a row address comprises applying a first bank address and a first row address to at least part of the data/address bus of the RDRAM.

11. The method of claim 10 wherein applying a first bank address and a first row address comprises applying the first row address to the data/address bus prior to the test and applying the first bank address to the data/address bus during the test.

12. The method of claim 7 wherein latching a row address further comprises applying a second bank address, a second row address and a column address to at least part of the data/address bus of the RDRAM.

13. The method of claim 12 wherein applying a second bank address, a second row address and a column address comprises applying the second row and the second bank address to the data/address bus prior to the test and applying the column address to the data/address bus during the test.

14. The method of claim 12 wherein applying a second bank address, a second row address and a column address comprises applying a column address to the data/address bus of the RDRAM that is different from the second row address applied to the data/address bus of the RDRAM.

15. A RAMBUS dynamic random access memory ("RDRAM"), comprising:
    a data/address bus;
    a row address latch circuit structured to latch a row address applied to at least part of the data/address bus responsive to a control signal;
    a data path circuit structured to couple data between a data bus port and the array of memory cells; and
    a test control circuit structured to selectively couple the row address latch circuit to a first portion of the RDRAM in response to a first control signal value indicating a normal operation of the RDRAM, and to a second portion of the RDRAM in response to a second control signal value indicating a test operation of the RDRAM.

16. The RDRAM of claim 15 further comprising a mode register coupled to the test control circuit, the mode register generating a core noise signal indicative of a core noise test to cause the test control circuit to couple the row address latch to the second portion of the RDRAM.

17. The RDRAM of claim 15 wherein the test control circuit comprises:
    a multiplexer having a first input coupled to a first input terminal of the RDRAM, a second input coupled to a second input terminal of the RDRAM, an output coupled to the row address latch circuit, and a control input receiving a control signal causing the multiplexer to selectively couple the output to either the first input or the second input; and
    a logic circuit coupled to the control input of the multiplexer, the logic circuit generating a control signal causing the multiplexer to couple its output to the first input during normal operation of the RDRAM and to couple its output to the second input prior to conducting the core noise test.

18. The RDRAM of claim 15 wherein the test control circuit is integrated with at least one of the row latch circuit or the data path circuit.

19. A method of manufacturing a RAMBUS dynamic random access memory ("RDRAM"), comprising:
    forming a data/address bus;
    forming a row address latch circuit adapted to latch a row address applied to at least part of the data/address bus responsive to a control signal;
    forming a data path circuit adapted to couple data between a data bus port and the array of memory cells; and
    forming a test control circuit adapted to selectively couple the row address latch circuit to a first portion of the RDRAM in response to a first control signal value indicating a normal operation of the RDRAM, and to a second portion of the RDRAM in response to a second control signal value indicating a test operation of the RDRAM.

20. The method of claim 19 further comprising forming a mode register coupled to the test control circuit, the mode register adapted to generate a core noise signal indicative of a core noise test to cause the test control circuit to couple the row address latch to the second portion of the RDRAM.

21. The method of claim 19 wherein the forming test control circuit comprises:
    forming a multiplexer having a first input coupled to a first input terminal of the RDRAM, a second input coupled to a second input terminal of the RDRAM, an output coupled to the row address latch circuit, and a control input receiving a control signal causing the multiplexer to selectively couple the output to either the first input or the second input; and
    forming a logic circuit coupled to the control input of the multiplexer, the logic circuit generating a control signal causing the multiplexer to couple its output to the first input during normal operation of the RDRAM and to couple its output to the second input prior to conducting the core noise test.

22. The method of claim 19 wherein forming the test control circuit comprises integrally forming the test control circuit with at least one of the row latch circuit or the data path circuit.

* * * * *